US010784390B2

United States Patent
Sakabe et al.

(10) Patent No.: US 10,784,390 B2
(45) Date of Patent: Sep. 22, 2020

(54) SOLAR CELL MODULE

(71) Applicants: TOYOTA JIDOSHA KABUSHIKI KAISHA, Toyota-shi (JP); KABUSHIKI KAISHA TOYOTA JIDOSHOKKI, Kariya-shi (JP)

(72) Inventors: Motoya Sakabe, Nisshin (JP); Kazuyoshi Ogata, Toyota (JP); Hirotaka Inaba, Kariya (JP)

(73) Assignees: TOYOTA JIDOSHA KABUSHIKI KAISHA, Toyota-shi (JP); KABUSHIKI KAISHA TOYOTA JIDOSHOKKI, Kariya-shi (JP)

( * ) Notice: Subject to any disclaimer, the term of this patent is extended or adjusted under 35 U.S.C. 154(b) by 0 days.

(21) Appl. No.: 16/184,245

(22) Filed: Nov. 8, 2018

(65) Prior Publication Data
US 2019/0189820 A1    Jun. 20, 2019

(30) Foreign Application Priority Data

Dec. 20, 2017 (JP) ................. 2017-244451

(51) Int. Cl.
| | |
|---|---|
| *H02N 6/00* | (2006.01) |
| *H01L 31/042* | (2014.01) |
| *H01L 31/048* | (2014.01) |
| *B32B 3/26* | (2006.01) |
| *B32B 27/08* | (2006.01) |

(Continued)

(52) U.S. Cl.
CPC ............ *H01L 31/048* (2013.01); *B32B 3/263* (2013.01); *B32B 27/08* (2013.01); *H02S 20/30* (2014.12); *B32B 2250/03* (2013.01); *B32B 2457/12* (2013.01); *B60R 16/03* (2013.01); *B62D 25/06* (2013.01); *H02S 99/00* (2013.01)

(58) Field of Classification Search
CPC ........ H01L 31/048; B32B 3/263; B60R 16/00
See application file for complete search history.

(56) References Cited

U.S. PATENT DOCUMENTS

| | | | | |
|---|---|---|---|---|
| 4,888,061 A | * | 12/1989 | Wenz ................ | H01L 31/03921 136/251 |
| 2013/0092457 A1 | * | 4/2013 | Wecker .................... | B60L 8/00 180/2.2 |

(Continued)

FOREIGN PATENT DOCUMENTS

| | | |
|---|---|---|
| JP | 2015-023070 | 2/2015 |
| JP | 2017-073466 | 4/2017 |

*Primary Examiner* — Angelo Trivisonno
(74) *Attorney, Agent, or Firm* — Oblon, McClelland, Maier & Neustadt, L.L.P.

(57) ABSTRACT

A solar cell module having curvature in a vehicle front-rear direction which varies from a vehicle front side towards a vehicle rear side, the solar cell module includes: a sealing layer formed from resin and in which power generating elements are sealed; a front surface layer formed from resin and joined to a light-receiving surface side of the power generating elements in the sealing layer; and a rear surface layer formed from resin and joined to an opposite side from the light-receiving surface side of the power generating elements in the sealing layer, wherein a plate thickness of portions where the front surface layer, the sealing layer, and the rear surface layer are laminated together is formed so as to become proportionately thinner as the curvature in the vehicle front-rear direction increases.

6 Claims, 10 Drawing Sheets

(51) Int. Cl.
*H02S 20/30* (2014.01)
*B60R 16/03* (2006.01)
*B62D 25/06* (2006.01)
*H02S 99/00* (2014.01)

(56) References Cited

U.S. PATENT DOCUMENTS

2013/0098447 A1* 4/2013 Obinata ............... H01L 31/048
  136/259
2017/0104440 A1 4/2017 Sakabe et al.

* cited by examiner

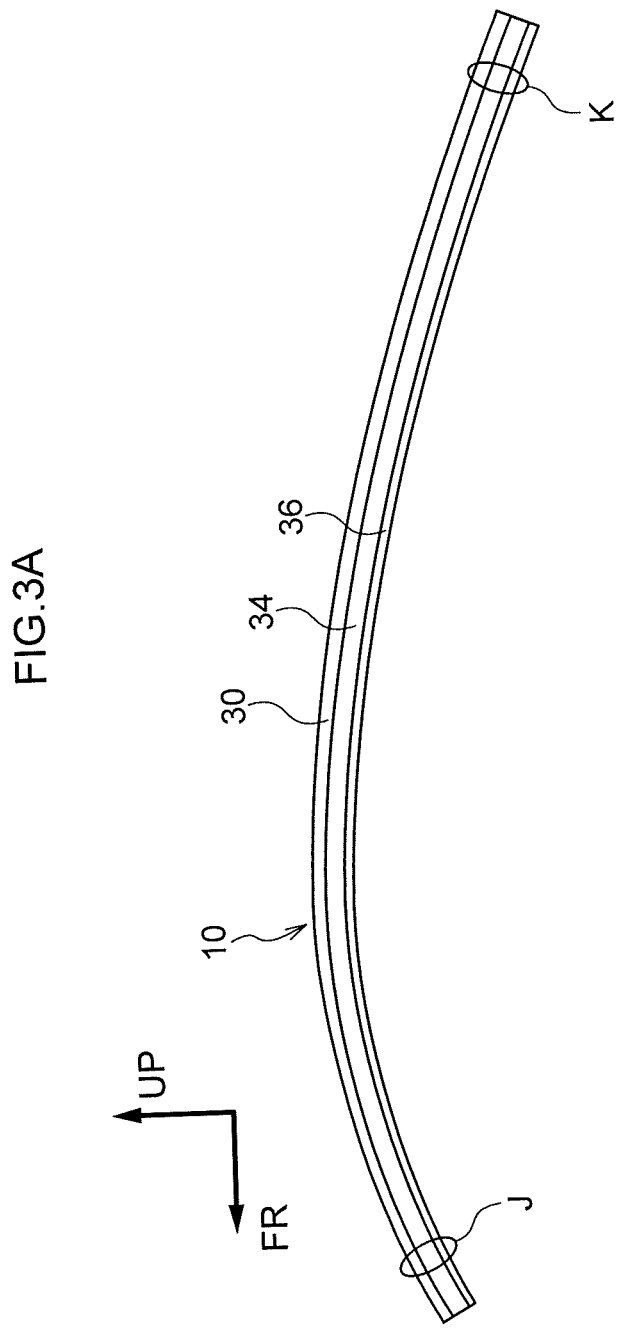

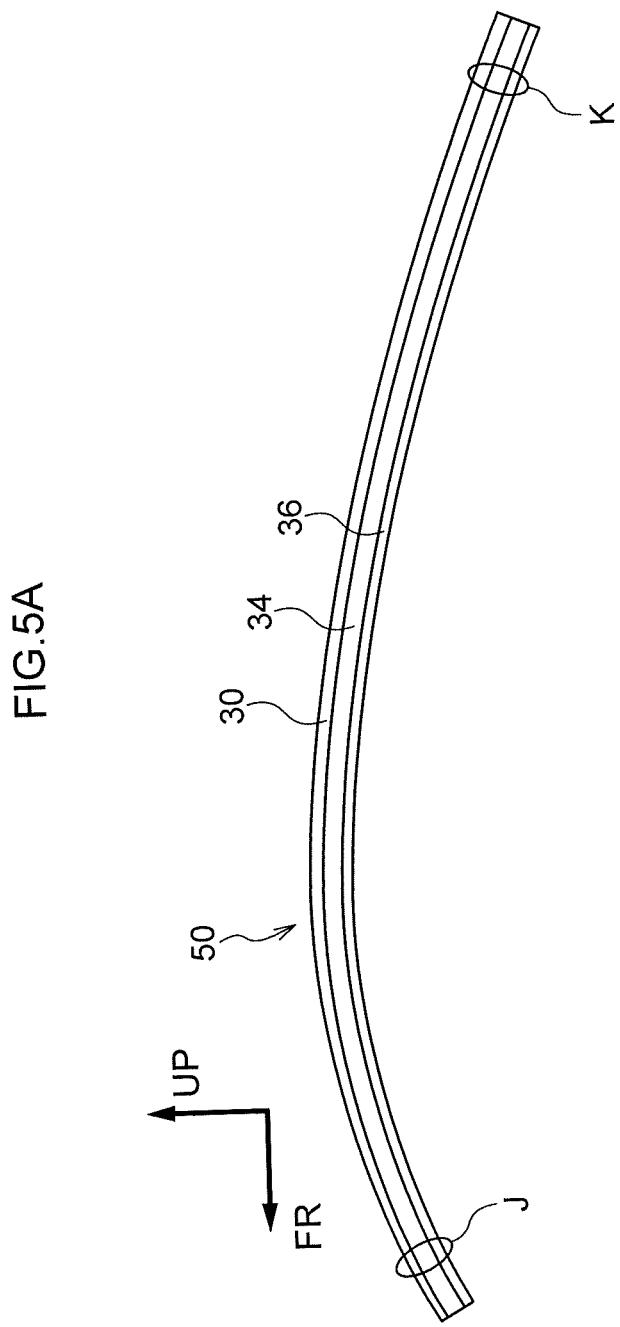

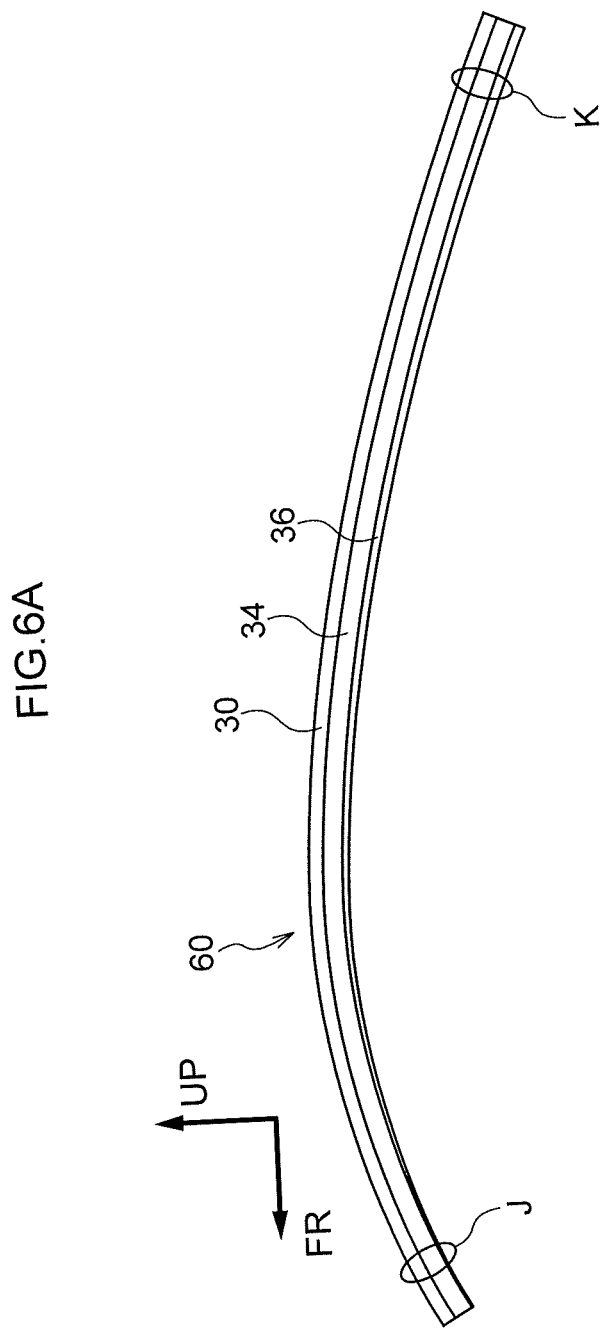

SOLAR CELL MODULE

CROSS-REFERENCE TO RELATED APPLICATION

This application claims priority under 35 USC 119 from Japanese Patent Application No. 2017-244451 filed on Dec. 20, 2017, the disclosure of which is incorporated by reference herein in its entirety.

BACKGROUND

Technical Field

The present disclosure relates to a solar cell module.

Related Art

Conventionally, as described in Japanese Unexamined Patent Application (JP-A) No. 2015-023070, a solar cell module is used in which a sealing layer that seals solar cells is sandwiched between a front surface layer, which is positioned on a light-receiving surface side of the solar cells, and a rear surface layer, which is positioned on the opposite side from the light-receiving surface. When a solar cell module is used as the roof of a vehicle, the front surface layer and the like are formed from resin in order to reduce weight. Additionally, the thicknesses of the front surface layer, the sealing layer, and the rear surface layer are formed so as to be uniform in the vehicle front-rear direction.

From the standpoint of providing an excellent design for a vehicle roof, the curvature thereof in the vehicle front-rear direction is changed continuously from the front of the vehicle towards the rear of the vehicle. Typically, because the bending rigidity increases proportionately as the curvature increases, when a solar cell module in which the thickness of each layer is formed uniformly is provided on the roof of a vehicle, then the solar cell module is formed at a uniform plate thickness that is able to guarantee a predetermined bending rigidity in those locations having the smallest curvature. In other words, the bending rigidity of the solar cell module is actually excessive in locations where the curvature is relatively large, and there is room for improvement from the standpoint of weight reduction.

SUMMARY

The present disclosure was conceived in consideration of the above-described circumstances, and an object of preferred embodiments is to provide, in a solar cell module whose curvature in the vehicle front-rear direction varies from the vehicle front side towards the vehicle rear side, a solar cell module whose weight is reduced at the same time as a predetermined bending rigidity is ensured.

A solar cell module of a first aspect of the present disclosure is a solar cell module having curvature in a vehicle front-rear direction which varies from a vehicle front side towards a vehicle rear side, the solar cell module includes a sealing layer that is formed from resin and in which power generating elements are sealed, a front surface layer that is formed from resin and is joined to a light-receiving surface side of the power generating elements in the sealing layer, and a rear surface layer that is formed from resin and is joined to an opposite side from the light-receiving surface side of the power generating elements in the sealing layer, wherein a plate thickness of portions where the front surface layer, the sealing layer, and the rear surface layer are laminated together is formed so as to become proportionately thinner as the curvature in the vehicle front-rear direction increases.

According to this structure, a solar cell module that is formed from resin is formed such that the plate thickness of portions where the front surface layer, the sealing layer, and the rear surface layer are laminated together becomes proportionately thinner as the curvature of the solar cell module in the vehicle front-rear direction increases. If the plate thickness of these portions is formed uniformly, then the bending rigidity of the solar cell module increases in those portions where the curvature is the greatest. Accordingly, by making the plate thickness proportionately thinner in portions where the curvature in the vehicle front-rear direction of the solar cell module is relatively greater, it is possible to achieve a uniform bending rigidity in the vehicle front-rear direction.

Typically, the plate thickness of a solar cell module is set uniformly so that a predetermined bending rigidity can be ensured in portions where the curvature in the vehicle front-rear direction is the smallest. However, in the solar cell module of the present disclosure, because the plate thickness is made proportionately thinner in portions where the curvature is greater compared to portions where the curvature in the vehicle front-rear direction is the smallest, it is possible to achieve a reduction in the weight of the solar cell module while simultaneously ensuring a predetermined bending rigidity over the entire area of the solar cell module.

A solar cell module of a second aspect of the present disclosure is the solar cell module of the first aspect, wherein the plate thickness of the front surface layer is formed so as to become proportionately thinner as the curvature in the vehicle front-rear direction of the solar cell module increases.

According to this structure, as the curvature in the vehicle front-rear direction of the solar cell module increases, the plate thickness of the front surface layer becomes proportionately thinner.

Accordingly, in order to ensure a predetermined bending rigidity over the entire solar cell module, it is possible to reduce the plate thickness of the front surface layer proportionately in portions where the curvature in the vehicle front-rear direction is greater, relative to the plate thickness of the front surface layer which is defined for portions where the curvature in the vehicle front-rear direction of the solar cell module is relatively smaller.

As a result, compared with a solar cell module in which the plate thickness of the front surface layer is uniform in the vehicle front-rear direction, because the plate thickness of the front surface layer is relatively thinner in portions where the curvature of the solar cell module is relatively greater, the transmittance of sunlight is increased, and it is possible to improve the overall power generation efficiency of the solar cell module.

A solar cell module of a third aspect of the present disclosure is the solar cell module of the second aspect, wherein the plate thickness of the rear surface layer is formed so as to be uniform in the vehicle front-rear direction.

In this solar cell module, the plate thickness of the rear surface layer is formed uniformly in the vehicle front-rear direction. Accordingly, in order to ensure a predetermined bending rigidity over the entire solar cell module, if the plate thickness is made proportionately thinner in portions where the curvature is relatively greater in comparison to the plate thickness that is set in portions where the curvature is the smallest, then the rate of change in the front surface layer increases. In other words, because the relative rate of decrease in the plate thickness of the front surface layer increases, the transmittance of sunlight is increased even further, and it is possible to improve the overall power generation efficiency of the solar cell module even more.

A solar cell module of a fourth aspect of the present disclosure is the solar cell module of any one of the first through third aspects, wherein a bending rigidity of the front surface layer is set higher than a bending rigidity of the rear surface layer.

In this solar cell module, the bending rigidity of the front surface layer is higher than the bending rigidity of the rear surface layer. Typically, an impact load is input into a solar cell module from a front surface layer side thereof, and the reason why the power generating elements are broken is because these power generating elements experience considerable deflection due to the input of the impact load. In order to reduce the amount of deflection experienced by the power generating elements, it is beneficial to increase the rigidity of the surface layer. Here, if the bending rigidity of the front surface layer is increased in comparison to the rear surface layer, then it is possible to suppress breakages of the power generating elements, while simultaneously suppressing any increase in the overall mass (i.e., while achieving a reduction in weight) of the solar cell module.

A solar cell module of a fifth aspect of the present disclosure is the solar cell module of any one of the first through fourth aspects, wherein the sealing layer is formed having a uniform plate thickness in the vehicle front-rear direction.

In this solar cell module, the plate thickness of the sealing layer is uniform in the vehicle front-rear direction. Accordingly, even if the plate thickness of the solar cell module is reduced in conjunction with the increase of the curvature in the vehicle front-rear direction of the solar cell module, the plate thickness of the sealing layer is not reduced. In other words, compared with a structure in which the plate thickness in the vehicle front-rear direction of the solar cell module is uniform, while the plate thickness is reduced in conjunction with the increase of the curvature and the weight of the solar cell module is reduced, the plate thickness of the sealing layer can be kept uniform, and the function thereof of protecting the power generating elements can be maintained in the vehicle front-rear direction.

Because the solar cell module of the first aspect has the above-described structure, a reduction in weight can be achieved at the same time as a predetermined bending rigidity is ensured for the solar cell module.

Because the solar cell module of the second and third aspects has the above-described structure, the power generating efficiency thereof can be improved.

Because the solar cell module of the fourth and fifth aspects has the above-described structure, a superior protection performance for the power generating element is achieved.

BRIEF DESCRIPTION OF THE DRAWINGS

Preferred embodiments will be described in detail based on the following figures, wherein:

FIG. 3A is a vertical cross-sectional view taken in a vehicle front-rear direction showing the solar cell module according to the first exemplary embodiment of the present disclosure;

FIG. 5A is a vertical cross-sectional view taken in a vehicle front-rear direction showing a solar cell module according to a second exemplary embodiment of the present disclosure;

FIG. 6A is a vertical cross-sectional view taken in a vehicle front-rear direction showing a solar cell module according to a third exemplary embodiment of the present disclosure;

DETAILED DESCRIPTION

First Embodiment

Figure 1:
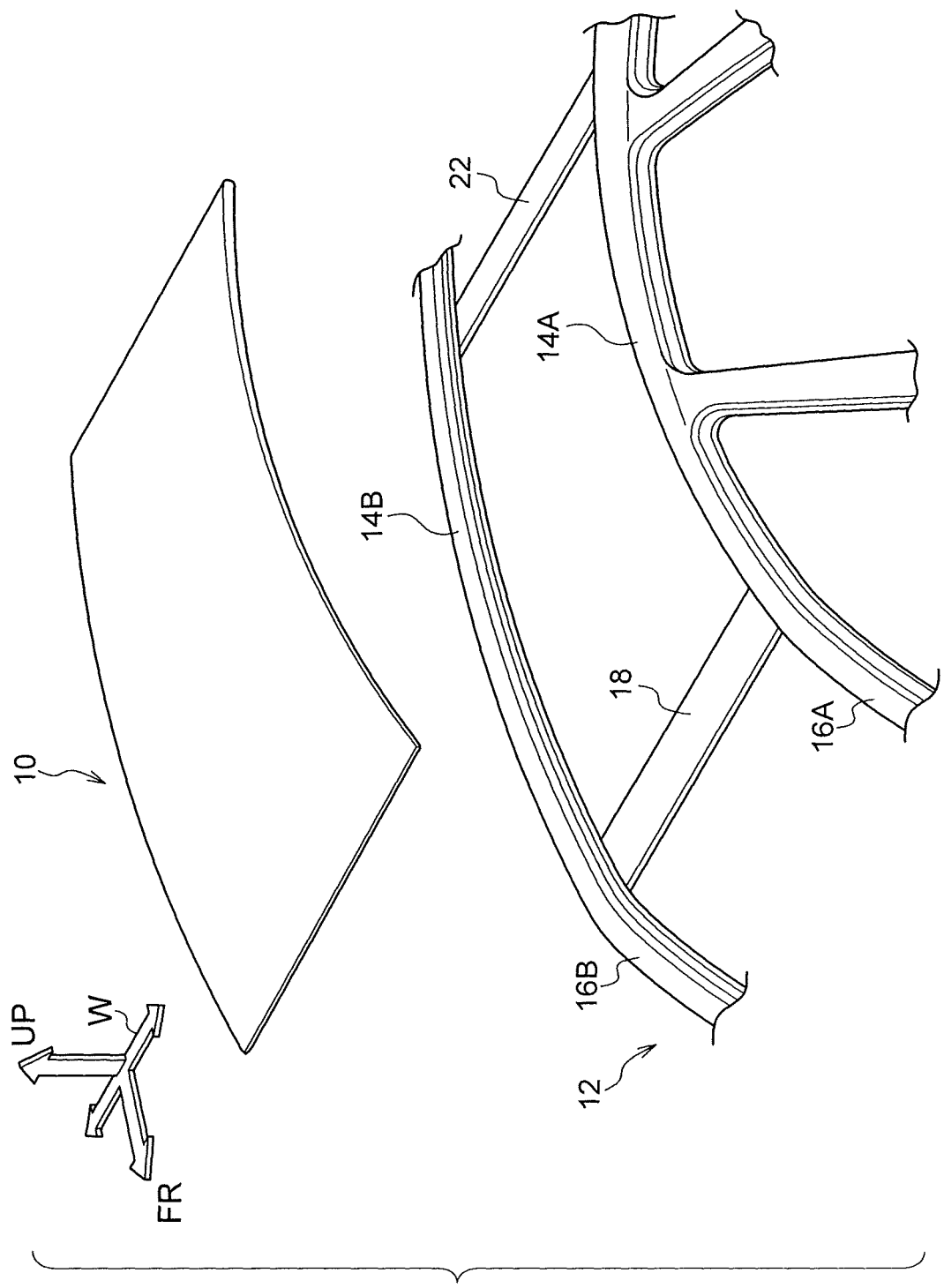
FIG. 1 is an exploded perspective view illustrating a state in which a solar cell module according to a first exemplary embodiment of the present disclosure is mounted on a vehicle body.

A solar cell module according to a first exemplary embodiment of the present disclosure will now be described with reference to FIG. 1 through FIG. 4D. Note that the solar cell module according to the present exemplary embodiment is mounted as a vehicle roof on a vehicle frame component. Moreover, each drawing is a typical view, and structure that has little or no relation to the present exemplary embodiment has been omitted from the drawings. Furthermore, an arrow FR, an arrow W, and an arrow UP that are shown in the drawings respectively indicate a vehicle forward direction, a vehicle width direction, and a vehicle upward direction.

(Structure)

As is shown in FIG. 1, a vehicle solar call module 10 according to the present exemplary embodiment is mounted as a roof on a vehicle body 12. A pair of roof side rails 14A and 14B are provided extending in the vehicle front-rear direction at both end portions in the vehicle width direction of the vehicle body 12 as components that support the solar cell module 10. The roof side rails 14A and 14B are formed integrally with front pillars 16A and 16B, and the like.

A front header member 18 and a rear header member 22 that extend in the vehicle width direction are provided in that sequence from the vehicle front side between the roof side rails 14A and 14B.

Figure 3B:
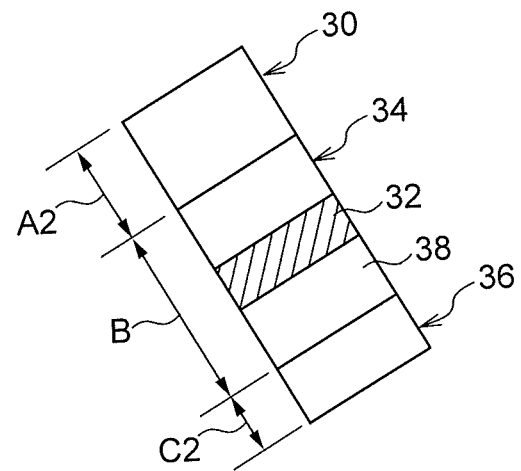
FIG. 3B is an enlarged cross-sectional view of an area J shown in FIG. 3A.
Figure 3C:
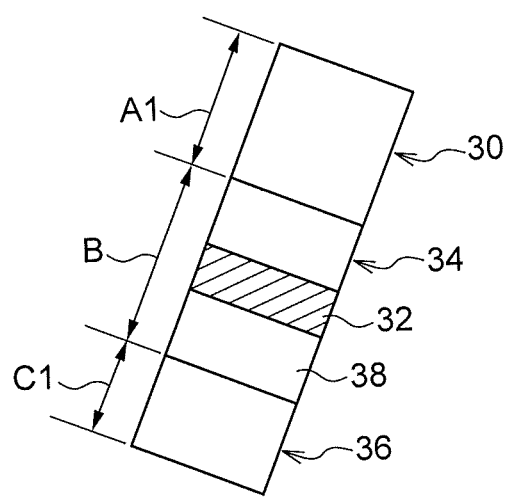
FIG. 3C is an enlarged cross-sectional view of an area K shown in FIG. 3A.

As is shown in FIG. 3A to FIG. 3C, the solar cell module 10 is provided with a front surface layer 30 that is optically transparent, a sealing layer 34 that is disposed at the vehicle lower side of the front surface layer 30 and in which are sealed power generating elements (i.e., solar cells) 32, and a rear surface layer 36 that supports the sealing layer 34 from the vehicle lower side. In other words, the solar cell module 10 is formed by laminating the front surface layer 30 onto the sealing layer 34 at a light-receiving surface side of the power generating elements 32, and the rear surface layer 36 onto the sealing layer 34 at an opposite side from the light-receiving surface side of the power generating elements 32. The solar cell module 10 containing the laminated front surface layer 30, sealing layer 34, and rear surface layer 36 is formed such that a curvature in the vehicle front-rear direction thereof monotonically decreases from the vehicle front side towards the vehicle rear side so as to correspond to a shape of the vehicle roof.

Figure 2:
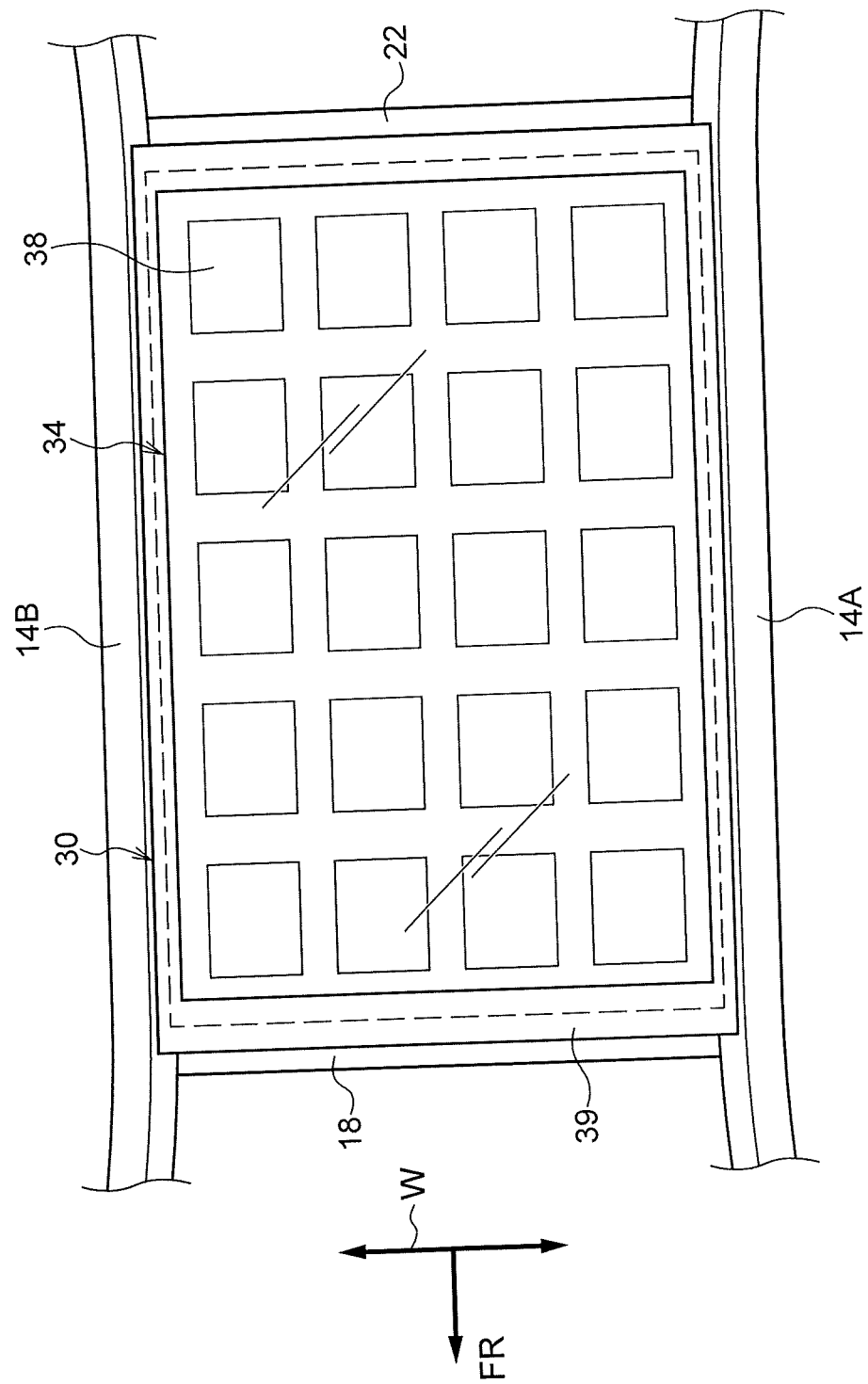
FIG. 2 is a plan view illustrating a state in which the solar cell module according to the first exemplary embodiment of the present disclosure is mounted on a vehicle body.

As is shown in FIG. 2, when looked at in plan view, the solar cell module 10 has a peripheral edge portion 39 which is formed as a result of the front surface layer 30 exclusively protruding beyond outer peripheral portions of the sealing layer 34 and the rear surface layer 36. The solar cell module 10 is mounted onto the front header member 18, the rear header member 22, and the roof side rails 14A and 14B via this peripheral edge portion 39.

Note that, in FIG. 3A, the peripheral edge portion 39 which is positioned at a vehicle front-side end portion and a vehicle rear-side end portion of the solar cell module 10, and protruding portions and the like of the rear surface layer 36 that are positioned at outer peripheral portions of the sealing layer 34 and are joined to a lower surface of the front surface layer 30 are omitted from the drawing.

As is shown in FIG. 2, when looked at in plan view, the front surface layer 30 is formed by a substantially rectangular resin sheet. This resin sheet is formed from transparent and extremely weather-resistant polycarbonate (PC). Because the resin sheet is lightweight as well as being extremely weather-resistant, it is extremely suited for the front surface layer 30 of the solar cell module 10 that is mounted on a vehicle. Note that in the present exemplary embodiment, the term 'resin' refers to transparent resin.

Moreover, as is shown in FIG. 3A, the front surface layer 30 is formed such that a thickness thereof in the direction of a radius of curvature thereof (hereinafter, referred to as the 'plate thickness' thereof) increases from the vehicle front side towards the vehicle rear side. In other words, the front surface layer 30 is formed such that the plate thickness thereof becomes proportionately thinner as the curvature in the vehicle front-rear direction of the front surface layer 30 increases. For example, a plate thickness A2 (see FIG. 3 B) of the front surface layer 30 in the vicinity of an end portion at a vehicle front side of the solar cell module 10 (i.e., an area J in FIG. 3 A) where the curvature in the vehicle front-rear direction is relatively greater is formed so as to be thinner than a plate thickness A1 (see FIG. 3 C) in the vicinity of an end portion at a vehicle rear side of the solar cell module 10 (i.e., an area K in FIG. 3 A) where the curvature is relatively smaller.

As is shown in FIG. 2 and FIG. 3 A through FIG. 3C, the sealing layer 34 is formed by plural power generating elements 32, and by a sealing material 38 that seals the power generating elements 32. The plural power generating elements 32 are arranged in a systematic pattern within the sealing layer 34, and are then sealed by the sealing material 38. The power generating elements 32 are known power generating elements such as silicon-based cells or the like. The sealing material 38 is formed as a film by mixing a silane coupling agent into an ethylene-vinyl acetate copolymer (EVA) that is transparent and has elasticity and adhesiveness.

Note that, as is shown in FIG. 3 A, the sealing layer 34 is formed having a uniform plate thickness from a vehicle front side thereof to a vehicle rear side thereof. In other words, in both the vicinity of an end portion at the vehicle front side (i.e., the area J in FIG. 3A) where the curvature is relatively greater, and the vicinity of an end portion at the vehicle rear side (i.e., the area K in FIG. 3A) where the curvature is relatively smaller, the sealing layer 34 is formed at a uniform plate thickness B (see FIG. 3B and FIG. 3C).

The rear surface layer 36 is formed by a rear surface plate. The rear surface plate is formed from the same PC as the front surface layer 30 in order to prevent any buckling of the solar cell module 10 that might be caused by using PC for the front surface layer 30.

The rear surface layer 36 is formed such that a plate thickness thereof increases from a vehicle front side towards a vehicle rear side. In other words, the rear surface layer 36 is formed such that the plate thickness thereof becomes proportionately thinner as the curvature in the vehicle front-rear direction of the rear surface layer 36 increases. For example, a plate thickness C2 (see FIG. 3B) of the rear surface layer 36 in the vicinity of an end portion at the vehicle front side of the solar cell module 10 (i.e., an area J in FIG. 3A) where the curvature in the vehicle front-rear direction is relatively greater is formed so as to be thinner than a plate thickness C1 (see FIG. 3C) in the vicinity of an end portion at the vehicle rear side (i.e., an area K in FIG. 3 A) where the curvature is relatively smaller.

In this way, the plate thicknesses of the front surface layer 30 and the rear surface layer 36 are increased monotonically so as to correspond to the monotonic decrease of the curvature in the vehicle front-rear direction of the solar cell module 10 from the end portion at the vehicle front side towards the end portion at the vehicle rear side. In contrast, the sealing layer 34 has a uniform plate thickness from the end portion thereof at the vehicle front side as far as the end portion thereof at the vehicle rear side. In other words, the plate thickness of the solar cell module 10 is increased monotonically so as to correspond to the monotonic decrease of the curvature of the solar cell module 10 from the end portion at the vehicle front side towards the end portion at the vehicle rear side whereby the predetermined bending rigidity of the solar cell module 10 is ensured.

As a consequence, the structure of the solar cell module 10 enables the bending rigidity in the vehicle front-rear direction to be uniformized, while enabling a predetermined bending rigidity to be ensured at each position in the vehicle front-rear direction. In other words, a predetermined bending rigidity to be ensured at the same time as the plate thickness at each position in the vehicle front-rear direction is held to a minimum thickness value.

(Actions)

Actions of the solar cell module 10 having the above-described structure will now be described.

As is shown in FIG. 1 and FIG. 3, the solar cell module 10 is mounted on the vehicle body 12 as the roof of the vehicle, and is formed having a streamlined shape in which the curvature in the vehicle front-rear direction changes continuously from the vehicle front side towards the vehicle rear side in a vehicle side view so as to correspond to the shape of the vehicle roof. In other words, the solar cell module 10 is formed such that the curvature thereof in the vehicle front-rear direction decreases monotonically from the vehicle front side towards the vehicle rear side.

Figure 4A:
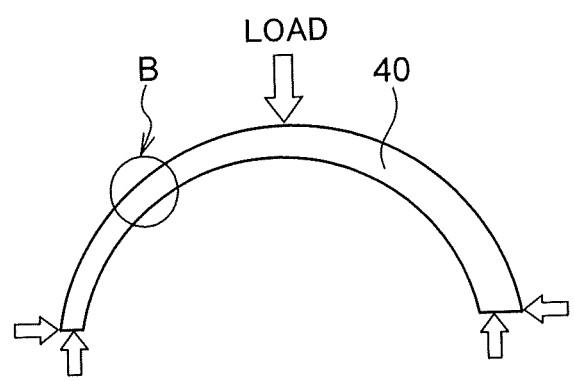
FIG. 4A is a view showing a load operating state of an arch.
Figure 4B:
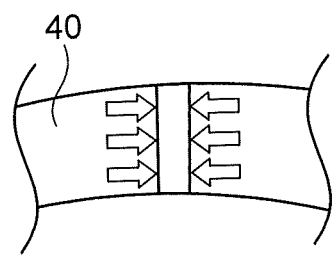
FIG. 4B is a view showing a stress operating state of a cross-section of an arch.
Figure 4C:
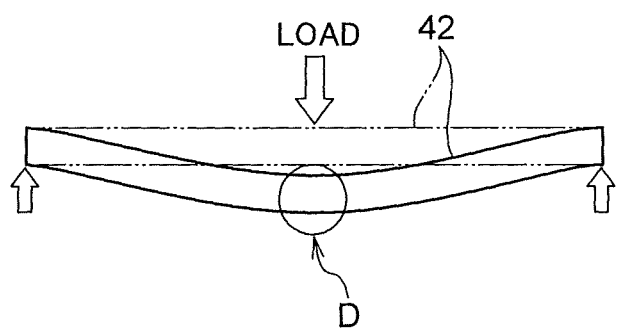
FIG. 4C is a view showing a load operating state of a simple beam.
Figure 4D:
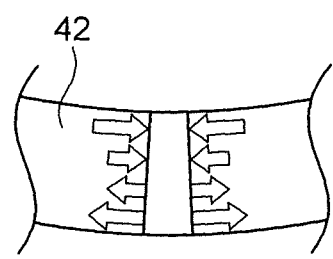
FIG. 4D is a view showing a stress operating state of a cross-section of a simple beam.

Generally, an arch has greater bending rigidity than a simple beam. In the case of an arch 40 (see FIG. 4A), if a load acting in a downward direction is applied to a center of this arch, then as is shown in FIG. 4B, compression stress acts uniformly at a cross-section thereof. In contrast, in the case of a simple beam 42 (see FIG. 4C), if a load acting in a downward direction is applied to a center of this simple beam, then as is shown in FIG. 4D, tensile stress acts at portions at a lower side of a neutral axis of a cross-section thereof.

Moreover, if the plate thickness of an arch is uniform, then the bending rigidity of that arch is proportionately stronger as the curvature thereof increases.

Therefore, in the solar cell module 10, the plate thickness thereof (i.e. the overall plate thickness when the front surface layer 30, the sealing layer 34, and the rear surface layer 36 are laminated together) is made proportionately thinner in portions where the curvature thereof in the vehicle front-rear direction is relatively greater. In particular, the plate thickness is reduced proportionately at portions where the curvature of the solar cell module 10 is greater relative to a plate thickness that is set in order to ensure a predetermined bending rigidity at portions where the curvature is at the minimum. By employing this structure, a reduction in the mass of the solar cell module 10 can be achieved compared with a solar cell module that is formed having a uniform plate thickness (hereinafter, referred to in cases as a 'uniform plate thickness solar cell module') which is set in order to ensure a predetermined bending rigidity at portions where the curvature is at the minimum.

In other words, by reducing the plate thickness of portions where the curvature of the solar cell module 10 is relatively greater compared to the plate thickness of portions where this curvature is relatively smaller, a predetermined bending rigidity over the entire range in the vehicle front-rear direction of the solar cell module 10 can be ensured at the same time as a reduction in the weight thereof is achieved.

In particular, by reducing the plate thickness of portions of the front surface layer 30 where the curvature is relatively greater compared to portions were the curvature is at the minimum, then compared with a structure in which the plate thickness of the front surface layer is uniform in the vehicle front-rear direction, it is possible to increase the sunlight transmittance and thereby increase the power generation efficiency of the solar cell module 10.

Moreover, by making the plate thickness of the sealing layer 34 uniform in the vehicle front-rear direction, even if the plate thickness of the solar cell module 10 varies in the vehicle front-rear direction, the ability of the sealing layer 34 to protect the power generating elements 32 can be uniformly maintained.

Second Embodiment

Figure 5B:
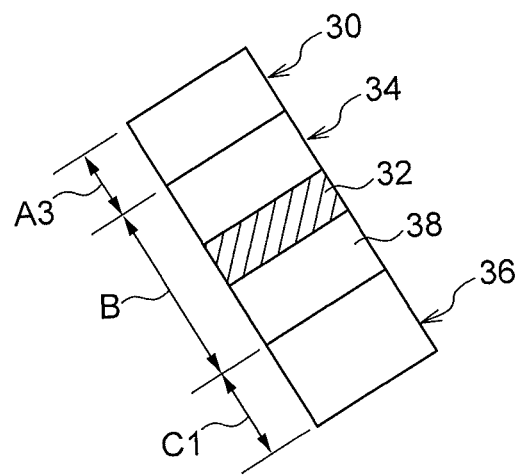
FIG. 5B is an enlarged cross-sectional view of an area J shown in FIG. 5A.
Figure 5C:
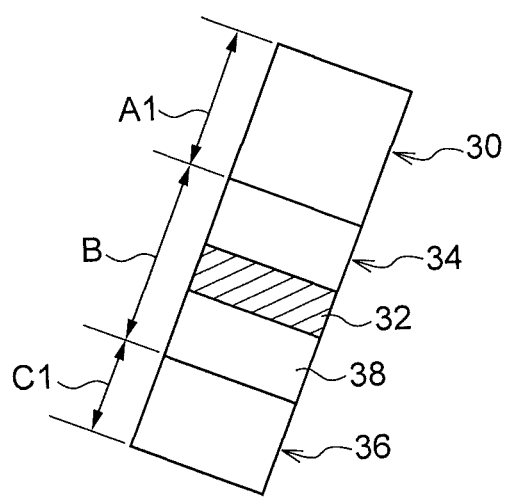
FIG. 5C is an enlarged cross-sectional view of an area K shown in FIG. 5A.

A solar cell module according to a second exemplary embodiment of the present disclosure will now be described with reference to FIG. 5. Note that component elements that are the same as in the first exemplary embodiment are given the same reference symbols and a detailed description thereof is omitted. Furthermore, as the second exemplary embodiment differs from the first exemplary embodiment only in the configuration of the front surface layer 30 and the rear surface layer 36, only these portions are described below.

In a solar cell module 50, the plate thickness of the front surface layer 30 is formed proportionately thinner in portions where the curvature in the vehicle front-rear direction is larger. In contrast, the sealing layer 34 and the rear surface layer 36 are formed having uniform plate thicknesses in the vehicle front-rear direction.

In other words, an adjustment is made to the plate thickness of just the front surface layer 30 such that the plate thickness of portions where the front surface layer 30, the sealing layer 34, and the rear surface layer 36 of the solar cell module 50 are laminated together is proportionately thinner in portions where the curvature in the vehicle front-rear direction is relatively greater. Accordingly, when the solar cell module 50 is formed having the minimum plate thickness that ensures a predetermined bending rigidity, this is achieved by changing the plate thickness of only the front surface layer 30 corresponding to the curvature of the solar cell module 50 in the vehicle front-rear direction. In other words, compared with a structure in which the plate thickness of the solar cell module is adjusted by changing the plate thicknesses of the front surface layer 30 and the rear surface layer 36, as is the case in the first exemplary embodiment, the rate of change in the plate thickness of the front surface layer 30 is greater. As a result, the plate thickness of the front surface layer 30 can be reduced even further in portions where the curvature in the vehicle front-rear direction is relatively greater, so that the transmittance of sunlight in the front surface layer 30 is improved.

As a result, in addition to a predetermined bending rigidity being ensured in the solar cell module 50 at the same time as the weight thereof is reduced, a further increase in the power generating efficiency thereof is also achieved.

Third Embodiment

Figure 6B:
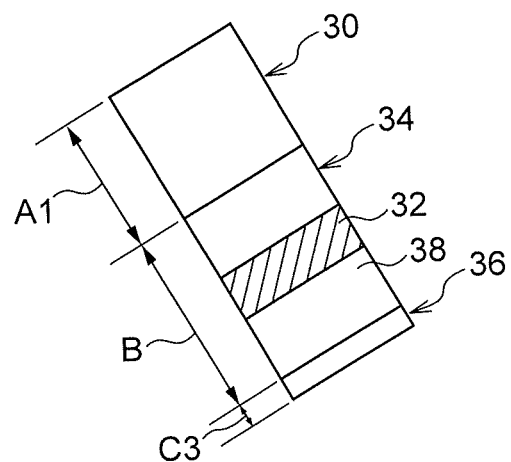
FIG. 6B is an enlarged cross-sectional view of an area J shown in FIG. 6A.
Figure 6C:
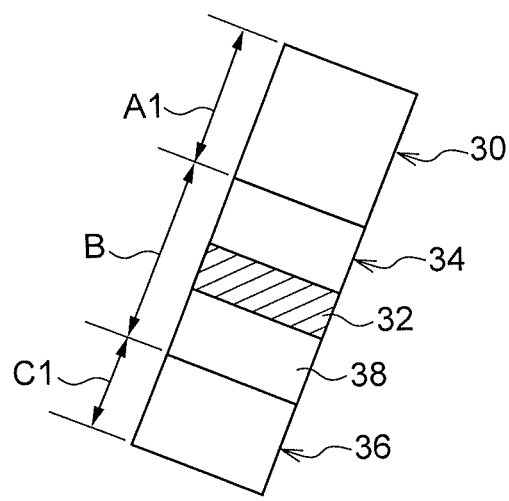
FIG. 6C is an enlarged cross-sectional view of an area K shown in FIG. 6A.

A solar cell module according to a third exemplary embodiment of the present disclosure will now be described with reference to FIG. 6. Note that component elements that are the same as in the first exemplary embodiment are given the same reference symbols and a detailed description thereof is omitted. Furthermore, as the third exemplary embodiment differs from the first exemplary embodiment only in the configuration of the front surface layer 30 and the rear surface layer 36, only these portions are described below.

(Structure)

In a solar cell module 60, the plate thickness of the rear surface layer 36 is formed proportionately thinner in portions where the curvature in the vehicle front-rear direction is larger. In contrast, the front surface layer 30 and the sealing layer 34 are formed having uniform plate thicknesses in the vehicle front-rear direction.

In other words, an adjustment is made via the plate thickness of just the rear surface layer 36 such that the plate thickness of portions where the front surface layer 30, the sealing layer 34, and the rear surface layer 36 of the solar cell module 60 are laminated together is proportionately thinner in portions where the curvature in the vehicle front-rear direction is relatively greater. Accordingly, when the solar cell module 60 is formed having the minimum plate thickness that ensures a predetermined bending rigidity, this is achieved by reducing the plate thickness of only the rear surface layer 36 corresponding to the curvature of the solar cell module 60 in the vehicle front-rear direction.

Furthermore, in the solar cell module 60, the plate thickness of the front surface layer 30 is set thicker than the plate thickness of the rear surface layer 36 at an end portion at the vehicle rear side where the plate thickness of the rear surface layer 36 is the largest. Because the plate thickness of the front surface layer 30 is uniform in the vehicle front-rear direction, over the entire range in the vehicle front-rear direction of the solar cell module 60, the plate thickness of the front surface layer 30 is formed so as to be thicker than the plate thickness of the rear surface layer 36. For example, in both the vicinity of the end portion at the vehicle front side (i.e., the area J in FIG. 6A) of the solar cell module 10, and the vicinity of the end portion at the vehicle rear side (i.e., the area K in FIG. 6A), the plate thickness A1 of the front surface layer 30 is set so as to be thicker than plate thicknesses C3 and C1 of the rear surface layer 36 (see FIG. 6B and FIG. 6C).

Here, because the front surface layer 30 and the rear surface layer 36 are both formed from polycarbonate (PC), the front surface layer 30 which has the relatively greater plate thickness has a higher bending rigidity than the rear surface layer 36.

(Actions)

In the solar cell module 60, the plate thickness (i.e. the plate thickness of portions where the front surface layer 30, the sealing layer 34, and the rear surface layer 36 are laminated together) is made proportionally thinner in portions where the curvature in the vehicle front-rear direction is greater. In particular, the plate thickness is reduced proportionately in portions where the curvature of the solar cell module 60 is greater relative to a plate thickness that is set in order to ensure a predetermined bending rigidity in portions where the curvature is at the minimum. By employing this structure, a reduction in the mass of the solar cell module 60 can be achieved (i.e., the weight of the solar cell module 60 can be reduced) compared with a solar cell module that is formed having a uniform plate thickness.

In other words, by reducing the plate thickness of portions where the curvature of the solar cell module 10 is relatively greater compared to the plate thickness of portions where this curvature is relatively smaller, a predetermined bending rigidity over the entire range in the vehicle front-rear direction of the solar cell module 10 can be ensured at the same time as a reduction in the weight thereof is achieved.

Moreover, in order to prevent the power generating elements 32 from being damaged as a result of an impact load being input into the solar ell module 60 from the outside (i.e., from above the vehicle), it is crucial that any deflection of the power generating elements 32 that might be caused by such an impact load be suppressed. In order to achieve a reduction in the weight of the solar cell module 60 while simultaneously suppressing any deflection of the power generating elements 32, it is necessary to increase the rigidity of the front surface layer 30.

Because the front surface layer 30 and the rear surface layer 36 of the solar cell module 60 are formed from the same material (i.e. polycarbonate), the bending rigidity of the front surface layer 30 is greater than the bending rigidity of the rear surface layer 36 as a result of the plate thickness of the front surface layer 30 being greater than the plate thickness of the rear surface layer 36 over the entire range in the vehicle front-rear direction.

Accordingly, even if an impact load from above a vehicle is input into the solar cell module 60 which has been installed on the roof of that vehicle, bending deformation of the front surface layer 30 is suppressed, and any damage to (i.e., breakage of) the power generating elements 32 can be either prevented or suppressed. In other words, an improvement in the impact resistance of the solar cell module 60 can be achieved.

In particular, in the solar cell module 60, because the plate thickness adjustment can be performed by changing the plate thickness of only the rear surface layer 36, the plate thicknesses of the front surface layer 30 and the sealing layer 34 can be kept uniform in the vehicle front-rear direction. Accordingly, the solar cell module 60 has even more superior impact resistance compared to a solar cell module in which the plate thicknesses of the front surface layer 30 and the sealing layer 34 gradually decrease approaching the vehicle front side.

In this way, in the solar cell module 60, because the plate thickness of the front surface layer 30 is set thicker than the plate thickness of the rear surface layer 36 at the end portion at the vehicle rear side where the curvature is the smallest, and because the plate thickness of only the rear surface layer 36 gradually decreases approaching the vehicle front side, in addition to a predetermined bending rigidity being ensured in the solar cell module 60 at the same time as the weight thereof is reduced, an improvement in the impact resistance thereof is also achieved.

(Variations)

Note that because the front surface layer 30 and the rear surface layer 36 are formed from the same resin in the solar cell module 60, the bending rigidity of the front surface layer 30 is set higher than the bending rigidity of the rear surface layer 36 using the size relationship between the respective plate thicknesses thereof, however, the present disclosure is not limited to this. For example, it is also possible to set the bending rigidity of the front surface layer 30 higher than the bending rigidity of the rear surface layer 36 by forming the front surface layer 30 and the rear surface layer 36 from different resins.

Additionally, in the solar cell modules 10 and 40 of the first exemplary embodiment and second exemplary embodiment as well, the same actions as those obtained from the present exemplary embodiment can be achieved by making the plate thickness of the front surface layer 30 thicker than the plate thickness of the rear surface layer 36.

In the foregoing series of exemplary embodiments, the roof shape is formed such that the curvature thereof in the vehicle front-rear direction decreases monotonically from the vehicle front side towards the vehicle rear side, however, the present disclosure is not limited to this. Provided that the curvature in the vehicle front-rear direction of the roof changes, then the present disclosure may be applied thereto. Furthermore, the present disclosure may also be applied to structures in which the plate thickness of a solar cell module is adjusted in accordance with the curvature thereof in the vehicle front-rear direction irrespective of the shape of the roof.

Moreover, in the foregoing series of exemplary embodiments, the plate thickness of the sealing layer 34 remains uniform, however, it is also possible to employ a structure in which the plate thickness of the sealing layer 34 changes in accordance with the curvature in the vehicle front-rear direction.

What is claimed is:

1. A solar cell module having curvature in a vehicle front-rear direction which varies from a vehicle front side towards a vehicle rear side, the solar cell module comprising:
    a sealing layer formed from resin and in which power generating elements are sealed;
    a front surface layer formed from resin and joined to a light-receiving surface side of the power generating elements in the sealing layer; and
    a rear surface layer formed from resin and joined to an opposite side from the light-receiving surface side of the power generating elements in the sealing layer,
    wherein a plate thickness of the solar cell module measured in a direction of a radius of curvature of the solar cell module and including portions where the front surface layer, the sealing layer, and the rear surface layer are laminated together, is formed to have a first plate thickness at an end portion towards the vehicle front side and have a second plate thickness at an end portion towards the vehicle rear side, the first plate thickness being thinner than the second plate thickness, wherein the plate thickness of the solar cell module becomes proportionately thinner as the curvature along a length of the solar cell module in the vehicle front-rear direction increases from the second plate thickness to the first plate thickness.

2. The solar cell module according to claim 1, wherein a plate thickness of the front surface layer is formed so as to be proportionately thinner as the curvature in the vehicle front-rear direction of the solar cell module increases.

3. The solar cell module according to claim 2, wherein a plate thickness of the rear surface layer is formed so as to be uniform in the vehicle front-rear direction.

4. The solar cell module according to claim 1, wherein a bending rigidity of the front surface layer is higher than a bending rigidity of the rear surface layer.

5. The solar cell module according to claim 1, wherein the sealing layer is formed having a uniform plate thickness in the vehicle front-rear direction.

6. The solar cell module according to claim 1, wherein the front surface layer is formed with a peripheral edge portion that exclusively protrudes beyond outer peripheral portions of the sealing layer and the rear surface layer, and the solar cell module is mounted onto a vehicle body via the peripheral edge portion.

* * * * *